United States Patent [19]

Hirko et al.

[11] 4,394,746
[45] Jul. 19, 1983

[54] SWAP GATE FOR ION-IMPLANTED CONTIGUOUS-DISK BUBBLE DEVICES

[75] Inventors: Richard G. Hirko; Kochan Ju, both of San Jose; Ian L. Sanders, Sunnyvale, all of Calif.

[73] Assignee: International Business Machines Corporation, Armonk, N.Y.

[21] Appl. No.: 331,481

[22] Filed: Dec. 16, 1981

[51] Int. Cl.³ .............................................. G11C 19/08
[52] U.S. Cl. ....................................................... 365/36
[58] Field of Search .................................... 365/15, 36

[56] References Cited

U.S. PATENT DOCUMENTS 4,142,250 2/1979 Keefe et al. ............................ 365/36
4,346,457 8/1982 Hu et al. ................................ 365/36

OTHER PUBLICATIONS

IEEE Transactions on Magnetics, vol. MAG-13, No. 6, Nov. 1977, pp. 1744-1764.
Bullock et al., Journal of Applied Physics, vol. 50, pp. 2222-2224, Mar. 1979.
R. Wolfe et al., Journal of Applied Physics, vol. 52, p. 2377, Mar. 1981.

Primary Examiner—James W. Moffitt
Attorney, Agent, or Firm—J. E. Kieninger

[57] ABSTRACT

A swap gate for ion-implanted contiguous disk bubble devices using folded minor loops is disclosed. The bubble device has a major loop, a folded minor loop and a swap element positioned between the major loop and the folded end of the minor loop. The swap element has a first portion for interchanging bubbles with the major loop, a second portion for receiving bubbles from a first region of the folded end of the minor loop, and a third portion for transferring bubbles from the first portion to a second region of the folded end of the minor loop. The folded end of the minor loop also has a third region positioned between the first and second regions to form two bubble storage locations. The bubble device has a conductor associated with the major loop and the first portion of the swap element to form a first transfer gate. The device also includes a second conductor associated with the folded minor loop and the second portion of the swap element to form a second transfer gate. The third portion of the swap element combines with the folded minor loop to form a merge element. In a preferred embodiment, the device has a quadruple period major loop which transfers a block of data into a single bit position on each of the minor loops.

9 Claims, 13 Drawing Figures

PRIOR ART     FIG. 1

SWAP GATE FOR ION-IMPLANTED CONTIGUOUS-DISK BUBBLE DEVICES

DESCRIPTION

TECHNICAL FIELD

This invention relates to ion-implanted contiguous-disk bubble devices and more particularly to a swap gate.

BACKGROUND ART

The block-replicate architecture which has been widely used in permalloy bubble devices requires the use of swap gates. Swap gates interchange bubbles between the write major loop path and the minor loop paths. Swap gates are referred to as true swap gates when the bubble in one path, for example the major loop, is transferred into the vacancy in the minor loop path that is left by the bubble which is being transferred from the minor loop into the major loop path. Although swap gates are most commonly used to interchange bubbles between the write major loop and the minor loops, they may also be employed in other parts of the bubble device wherever data in two separate paths need to be exchanged. All true swap gates used in permalloy-type bubble devices such as the one described by Bullock et al in the *Journal of Applied Physics*, Vol. 50, pages 2222-4, March 1979, employ conductors to activate the transfer of bubbles. Due to the fundamental difference between permalloy type bubble devices and ion-implanted contiguous-disk bubble devices, the swap gate designs for permalloy bubble devices cannot be implemented in ion-implanted contiguous-disk bubble devices.

An example of a two-way transfer gate that does not employ conductors for ion-implanted contiguous disk bubble devices was described by R. Wolfe et al in *Journal of Applied Physics*, Vol. 52, page 2377-2379 (March 1981) and is shown in FIG. 1. This arrangement, which includes a major loop, a minor loop and a swap or idler disk element positioned therebetween is a simple bidirectional reverse rotation transfer gate. FIG. 1 illustrates in three steps how one and a half reverse rotations starting at 270° and ending at 90° are used to transfer a bubble from the upper loop part way around an idler disk to a lower loop. Transfer in the opposite direction is very similar with reverse rotation starting at 90° and ending at 270°. When a transfer-out reverse rotation cycle in this device is followed immediately by a transfer-in sequence, the bit that is removed from the minor loop is replaced by a new one from the major loop. This is not a true swap gate, however, since the bit from the major loop is placed in the minor loop one rotating field cycle behind the replacement bit. For example, the bubble 12 from the major loop is one cycle behind the vacant position 14 which the bubble previously residing in the minor loop occupied prior to the swap operation. In a true swap gate arrangement, the incoming bubble 12 would be transferred into position 14. The FIG. 1 structure is also not a swap gate because data must be completely cleared from the minor loops and positioned in the major loop before new data can be entered into the minor loops. The bubble industry that uses swap gates for their permalloy bubble devices have reported that their work on contiguous-disk bubble devices has been handicapped by the unavailability of a swap gate.

A folded minor loop arrangement for the transfer of bubbles in ion-implanted contiguous-disk bubble devices is disclosed in co-pending patent application Ser. No. 316,250 filed Oct. 29, 1981 and assigned to the assignee of the present invention. This bubble device has a major loop, folded minor loops and a transfer element positioned between the major loop and the folded end of the minor loops. In one embodiment the transfer element has a merge portion adjacent and in spaced relation to one portion of the folded end of the minor loop. While this arrangement provides an improved transfer gate from the major loop to the minor loop, it is not a swap gate because bubbles can be transferred in one direction only.

SUMMARY OF THE INVENTION

It is a primary object of this invention to provide a swap gate for contiguous-disk bubble devices.

It is another object of this invention to provide an improved major/minor loop arrangement for ion-implanted contiguous-disk bubble devices.

It is yet another object of this invention to provide a swap gate for contiguous disk bubble devices that uses a quadruple period major loop.

It is yet another object of this invention to provide a swap gate for a contiguous-disk bubble device that uses a double period major loop.

These and other objects are accomplished by the disclosed swap gate for ion-implanted contiguous disk bubble devices using folded minor loops. The bubble device has a major loop, a folded minor loop and a swap element positioned between the major loop and the folded end of the minor loop. The swap element has a first portion for interchanging bubbles with the major loop, a second portion for receiving bubbles from a first region of the folded end of the minor loop, and a third portion for transferring bubbles from the first portion to a second region of the folded end of the minor loop. The folded end of the minor loop also has a third region positioned between the first and second regions to form two bubble storage locations. The bubble device has a conductor associated with the major loop and the first portion of the swap element to form a first transfer gate. The device also includes a second conductor associated with the folded minor loop and the second portion of the swap element to form a second transfer gate. The third portion of the swap element combines with the folded minor loop to form a merge element. The merge element may either be passive or include a third transfer conductor. In a preferred embodiment, the device has a quadruple period major loop which transfers a block of data into a single bit position on each of the minor loops. In another preferred embodiment, the bubble device has a double period major loop which transfers a block of data into two consecutive bit positions in each of the minor loops.

Other objects of this invention will be apparent from the following detailed description, reference being made to the accompanying drawings wherein the specific embodiments of the invention are shown.

BRIEF DESCRIPTION OF THE DRAWINGS

FIG. 1 is a top view of a prior art transfer gate;

DESCRIPTION OF THE PREFERRED EMBODIMENTS

Figure 2:
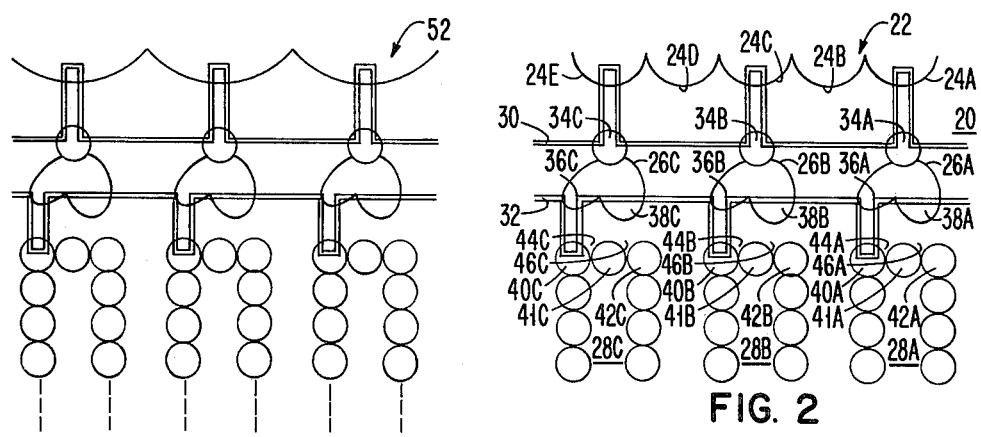
FIG. 2 is a top view of a preferred embodiment of a swap gate in accordance with this invention using a double period major loop.

As shown in FIG. 2, in a preferred embodiment, the ion-implanted contiguous-disk bubble device 20 includes a write major loop 22 consisting of sections 24A, 24B, 24C, 24D and 24E. The periodicity of sections 24A–E in the major loop 22 is about twice the periodicity of the minor loop sections in the storage area. Swap elements 26A, 26B and 26C are positioned between the major loop 22 and minor loops 28A, 28B and 28C respectively.

A conductor 30 is associated with major loop path 22 sections 24A, 24C and 24E as well as with swap element first portions 34A, 34B and 34C to form a transfer gate therebetween. A conductor 32 is positioned over the swap element second portion 36A, 36B and 36C as well as over the minor loop folded end region 40A, 40B and 40C respectively, to form a transfer gate therebetween. Swap element third portions 38A, 38B and 38C are in spaced relation with minor loop folded end regions 42A, 42B and 42C to form merge elements therebetween. Minor loop folded end regions 41A, 41B and 41C separate folded end regions 40A, 40B and 40C from folded end regions 42A, 42B and 42C respectively to form two bubble storage locations 44A and 46A; 44B and 46B; and 44C and 46C. The use of the two storage locations 44 and 46 at each folded end is essential for the preservation of the data integrity.

Figure 3A:
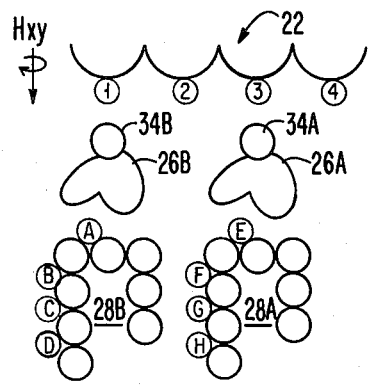
FIGS. 3A-I are top views showing the operation of the device shown in FIG. 2.
Figure 3B:
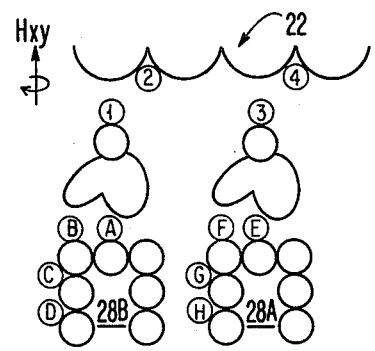

The operation of the FIG. 2 swap gate is illustrated in detail in FIGS. 3A through 3I. For clarity, the overlaying conductor patterns (30 and 32 of FIG. 2) are omitted. A row of bubbles labeled 1, 2, 3 and 4 is located on the major loop 22. A set of bubbles labeled A, B, C, D is located on minor loop 28B and a set of bubbles E, F, G, H is located on minor loop 28A. The instantaneous direction of the rotating in-plane field ($H_{xy}$) is pointed downward in FIG. 3A. At this phase of the rotating field, the current in conductor 30 (not shown) is turned on thereby holding bubbles 1 and 3 in their respective positions. When the in-plane field has rotated through 180°, bubbles 1 and 3 are attracted to the charge walls on the tips of the portions 34A and 34B of the swap elements 26A and 26B and are propagated as shown in FIG. 3B. At the same time, the bubbles on the minor loops 28A and 28B are transferred to the next bit position as also shown in FIG. 3B.

Figure 3C:
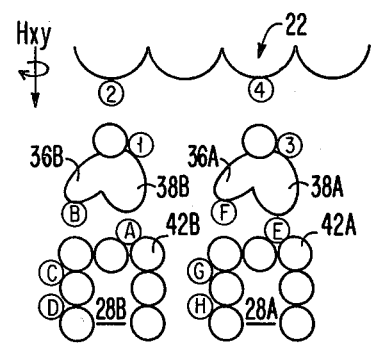
Figure 3D:
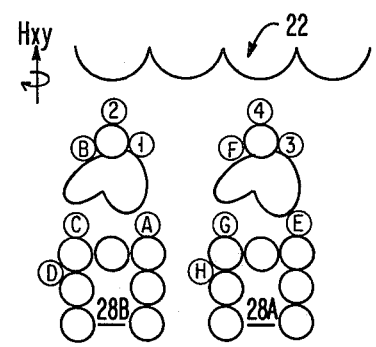
Figure 3E:
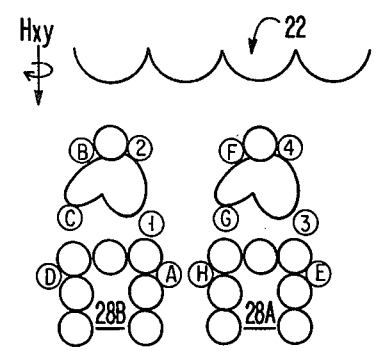
Figure 3F:
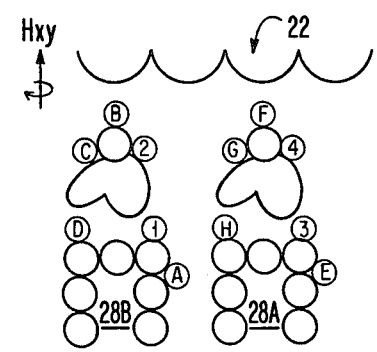
Figure 3G:
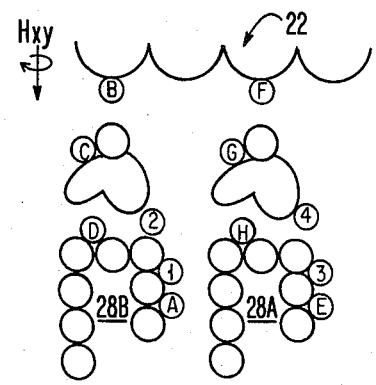
Figure 3H:
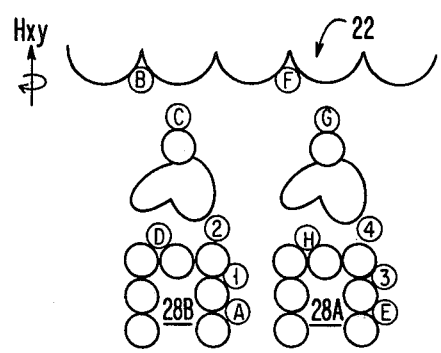

The current in conductor 30 is then turned off and the current in conductor 32 is turned on. As the in-plane field rotates through another 180°, the bubbles B and F from minor loops 28B and 28A respectively are transferred to the adjacent tips of the swap element second portion 36A and 36B. At this time the current in conductor 32 is turned off and the bubbles are positioned as shown in FIG. 3C. Bubbles 2 and 4 in the major loop 22 are now in position to be transferred on the next rotating field cycle as shown in FIG. 3D.

In the continuing operating sequence shown in FIG. 3C to FIG. 3F, bubbles A and E pass through the passive merge gate that is formed by third portion 38A and 38B of the swap element and the second region 42B and 42A of the folded end of the minor loops 28A and 28B. At the same time bubbles 1 and 3 treat the gap of the passive merge gate as though it were a cusp, and are able to propagate into the minor loops 28A and 28B.

Figure 3I:
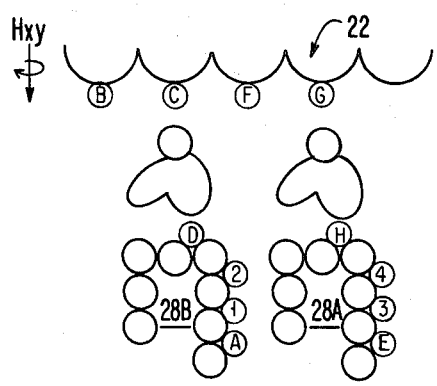

The bubbles progress in response to the rotating drive field as shown in the remaining FIGS. 3E through 3I until in FIG. 3I bubbles B, C, F and G are transferred to the major loop 22 while bubbles 1 and 2 are in the correct position on minor loop 28B and bubbles 3 and 4 are in the correct position on the minor loop 28A.

Bubbles B, C, F and G do not take the same bit positions in the major loop vacated by bubbles 1, 2, 3 and 4. However, since they do not require to be interleaved with an existing data pattern, the utility of the swap function is not affected.

Figure 4:
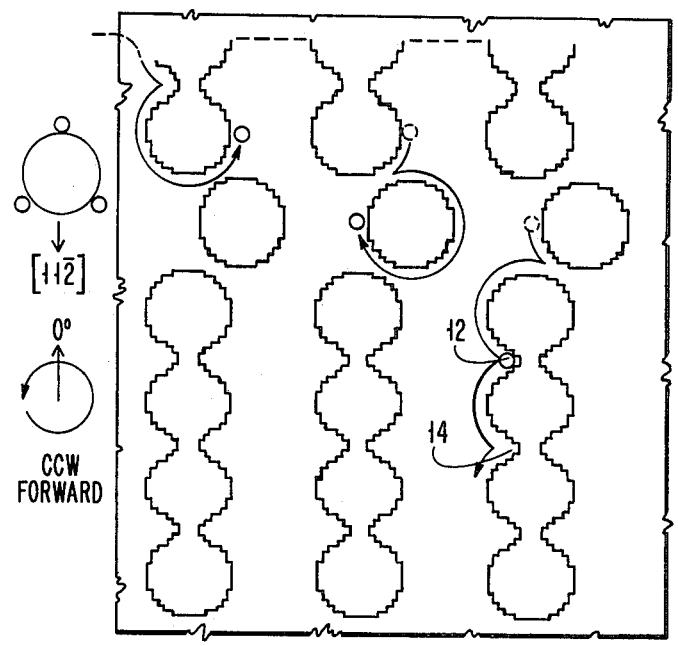
FIG. 4 is a top view of a second preferred embodiment of a swap gate in accordance with this invention using a quadruple period major loop.

An alternate embodiment is shown in FIG. 4 in which the major loop 52 has a quadruple period. A major loop periodicity of approximately four times the minor loop period is desirable because it permits bubbles to be transferred from adjacent locations or sections on the write major loop to adjacent minor loops. The embodiment shown in FIG. 4 operates in a similar fashion as described in FIG. 3 except that a block of data consists of just one bit on each of the minor loops.

Figure 5:
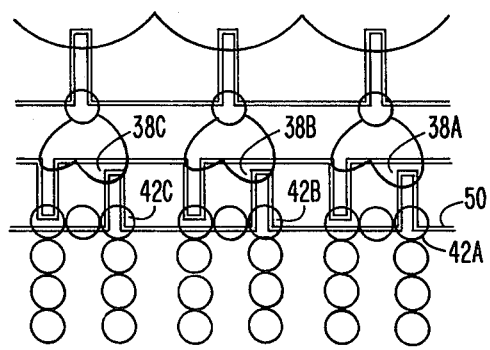
FIG. 5 is a top view of a third embodiment of a swap gate in accordance with this invention.

Another embodiment shown in FIG. 5 differs from the FIG. 4 embodiment by the presence of a third conductor 50 that is positioned over the swap element third portion 38A, 38B and 38C as well as over minor loop folded end region 42A, 42B and 42C respectively to form active merge elements therebetween.

Although a preferred embodiment of this invention has been described, it is understood that numerous variations may be made in accordance with the principles of this invention.

What is claimed is:

1. A swap gate for ion-implanted contiguous-disk bubble devices comprising
   a major loop,
   a minor loop having a folded end portion facing said major loop, said end portion having a first region and a second region separated by a third region,
   a swap element positioned between said major loop and said minor loop, said swap element having a first portion associated with said major loop, said swap element having a second portion associated with said first region, said swap element having a third portion associated with said second region to form a merge gate, and
   conductor means associated with said swap element whereby activation of said conductor means causes the swap function to be effected.

2. A swap gate as described in claim 1 wherein said major loop has a period of approximately four times the minor loop period.

3. A swap gate as described in claim 2 wherein said first portion faces and is in spaced relation with said major loop.

4. A swap gate as described in claim 2 wherein said second portion faces and is in spaced relation with said first region.

5. A swap gate as described in claim 2 wherein said third portion faces and is in spaced relation with said second region.

6. A swap gate for ion-implanted disk bubble devices comprising
   a major loop,
   a minor loop having a folded end portion facing said major loop, said end portion having a first region and a second region separated by a third region, a swap element positioned between said major loop and said minor loop, said swap element having a first portion associated with said major loop, said swap element having a second portion associated with said first region, said swap element having a third portion associated with said second region to form a merge gate, a first conductor associated with said major loop and said first portion to form a first transfer gate, and a second conductor associated with said second portion and said first region to form a second transfer gate whereby said merge gate combines with said first and second transfer gates to perform the swap function when said conductors are activated.

7. A swap gate as described in claim 6 wherein said third region combines with said first and second regions to form two bubble storage locations.

8. A swap gate as described in claim 6 wherein said major loop has a period of approximately twice the minor loop period.

9. A swap gate for ion-implanted contiguous-disk bubble devices comprising a major loop, a minor loop having a folded end portion facing said major loop, said end portion having a first region and a second region separated by a third region, a swap element positioned between said major loop and said minor loop, said swap element having a first portion associated with said major loop, said swap element having a second portion associated with said first region, said swap element having a third portion associated with said second region, a first conductor associated with said major loop and said first portion to form a first transfer gate, a second conductor associated with said second portion and said first region to form a second transfer gate, and a third conductor associated with said third portion and said second region to form a merge gate whereby said merge gate combines with said first and second transfer gates to perform the swap function when said conductors are activated.

* * * * *